(12) United States Patent
Zhang et al.

(10) Patent No.: US 11,482,446 B1
(45) Date of Patent: Oct. 25, 2022

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/599,758

(22) PCT Filed: Jun. 1, 2021

(86) PCT No.: PCT/CN2021/097761
§ 371 (c)(1),
(2) Date: Sep. 29, 2021

(87) PCT Pub. No.: WO2022/022055
PCT Pub. Date: Feb. 3, 2022

(30) Foreign Application Priority Data

Jul. 27, 2020 (CN) .......................... 202010732615.9

(51) Int. Cl.
*H01L 21/762* (2006.01)
*H01L 29/40* (2006.01)
(Continued)

(52) U.S. Cl.
CPC .................. *H01L 21/76224* (2013.01); *H01L 21/823481* (2013.01); *H01L 29/0649* (2013.01); *H01L 29/401* (2013.01); *H01L 29/4236* (2013.01)

(58) Field of Classification Search
CPC ....... H01L 21/76224; H01L 21/823481; H01L 29/0649; H01L 29/4236
See application file for complete search history.

(56) References Cited

U.S. PATENT DOCUMENTS 6,265,302 B1   7/2001  Lim et al.
6,645,867 B2  11/2003  Dokumaci et al.
(Continued)

FOREIGN PATENT DOCUMENTS

CN   106992156 A      7/2017
CN   107946232 A  *   4/2018
(Continued)

OTHER PUBLICATIONS

International Search Report and English Translation as cited in PCT/CN2021/097761 dated Aug. 19, 2021, 10 pages.
(Continued)

*Primary Examiner* — Joseph C. Nicely
(74) *Attorney, Agent, or Firm* — Cooper Legal Group, LLC

(57) ABSTRACT

The present disclosure discloses a semiconductor device manufacturing method and a semiconductor device, relating to the technical field of semiconductors. The method includes: providing a semiconductor substrate, the semiconductor substrate comprising a shallow trench and active areas; forming an oxygen-containing layer on exposed outer surfaces of the shallow trench and the active areas; filling a first isolation layer of a set height in the shallow trench comprising the oxygen-containing layer on its surface, the set height being lower than heights of the active areas; forming an etch stop layer on an upper surface of the first isolation layer; filling a second isolation layer on the etch stop layer in the shallow trench to form a shallow trench isolation (STI) structure; and etching the active areas and the STI structure to form wordline trenches, the bottoms of the wordline trenches in the STI structure are higher than the set height.

18 Claims, 16 Drawing Sheets

(51) Int. Cl.
*H01L 29/423* (2006.01)
*H01L 29/06* (2006.01)
*H01L 21/8234* (2006.01)

(56) References Cited

U.S. PATENT DOCUMENTS 9,859,284 B2 1/2018 Wang
2014/0306277 A1 10/2014 Asao

FOREIGN PATENT DOCUMENTS

CN 107946232 A 4/2018
JP 2013026431 A 2/2013

OTHER PUBLICATIONS

Written Opinion and English Translation as cited in PCT/CN2021/097761 dated Aug. 19, 2021, 9 pages.

\* cited by examiner

METHOD FOR MANUFACTURING SEMICONDUCTOR DEVICE AND SEMICONDUCTOR DEVICE

CROSS-REFERENCE TO RELATED APPLICATIONS

The present disclosure claims the priority to Chinese Patent Application 202010732615.9, titled "METHOD FOR MANUFACTURING SEMICONDUCTOR DEVICE AND SEMICONDUCTOR DEVICE", filed on Jul. 27, 2020, which is incorporated herein by reference in its entirety.

TECHNICAL FIELD

The present disclosure relates to the technical field of semiconductors, and in particular, to a method for manufacturing a semiconductor device and a semiconductor device.

BACKGROUND

In the sub-micron technology, shallow trench isolation (STI) structures have replaced other semiconductor device isolation methods, for example the local oxidation of silicon (LOCOS) technology which requires a larger valuable area.

In the shallow trench isolation process, shallow trenches are formed in the semiconductor substrate between the semiconductor active areas (which, for example, may be used to form the gate and the source/drain), and the MOSFETs are electrically isolated from each other. The shallow trench is filled with insulating material, for example silicon oxide, to provide electrical insulation.

In the related technologies, when WL (wordline) trenches are formed, due to the etch selectivity ratio, the depths of the WL trenches formed in the active areas and the STI are different, so that the metal gates of the WLs formed by deposition are different in depth at the bottoms of the WL trenches. As a result, the metal gate in the STI structure may be coupled with the active area and the adjacent gate to form the parasitic capacitance which in turn leads to current leakage.

In addition, the different depths of the metal gates at the bottom also lengthens the effective length of the wire and increases the wire resistance.

It is to be noted that the information disclosed in the background section is only provided to facilitate the understanding of the background of the present disclosure, and therefore may include information that does not constitute the existing technologies known to a person of ordinary skill in the art.

SUMMARY

An embodiment of the present disclosure provides a method for manufacturing a semiconductor device, comprising: providing a semiconductor substrate, the semiconductor substrate comprising a shallow trench and active areas isolated from the shallow trench; forming an oxygen-containing layer on exposed outer surfaces of the shallow trench and the active areas; filling a first isolation layer of a set height in the shallow trench comprising the oxygen-containing layer on the surface of the shallow trench, the set height being lower than heights of the active areas; forming an etch stop layer on an upper surface of the first isolation layer; filling a second isolation layer on the etch stop layer in the shallow trench to form a shallow trench isolation structure; and etching the active areas and the shallow trench isolation structure to form wordline trenches, wherein bottoms of the wordline trenches in the shallow trench isolation structure are higher than the set height.

An embodiment of the present disclosure provides a semiconductor device, comprising: a semiconductor substrate, comprising: a shallow trench; and active areas isolated from the shallow trench. An oxygen-containing layer is formed at a bottom of the shallow trench and surfaces of the active areas; a first isolation layer of a set height is filled on an upper surface of the oxygen-containing layer corresponding to the shallow trench, the set height being lower than heights of the active areas; an etch stop layer is formed on an upper surface of the first isolating layer; a shallow trench isolation structure is formed on the etch stop layer in the shallow trench, and the shallow trench isolation structure is formed by filling a second isolation layer; and wordline trenches are formed in the shallow trench isolation structure and the active areas, wherein bottoms of the wordline trenches in the shallow trench isolation structure are higher than the set height.

In the method for manufacturing the semiconductor device according to some embodiments of the present disclosure, an etch stop layer is formed at a set height of the first isolation layer in the shallow trench during the formation of the STI so that, during the subsequent formation of the WL trenches by etching, the further etching of the WL trenches in the STI structure can be stopped by the etch stop layer. In this way, the depths of WL trenches of almost the same as those of the WL trenches in the active areas may be formed in the STI structure. On one hand, since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. On the other hand, the length of the WLs can be shortened to reduce the conductive resistance.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
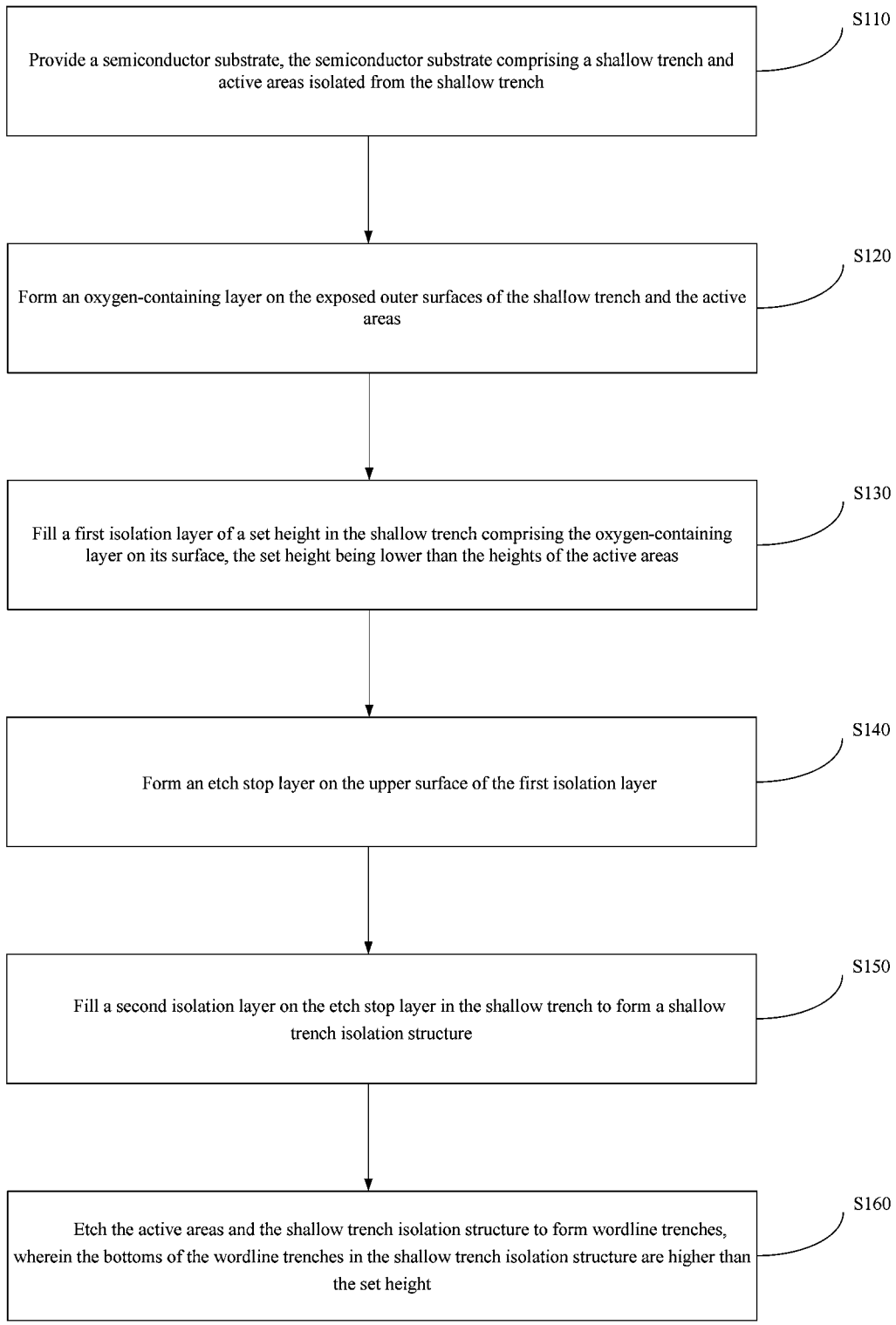
FIG. 1 schematically shows a flowchart of a method for manufacturing a semiconductor device according to an embodiment of the present disclosure.

Exemplary implementations will now be described more fully with reference to the accompanying drawings. However, the exemplary implementations may be implemented in various forms, and should not be construed as being limited to the implementations set forth herein; instead, these implementations are provided to make the present disclosure more comprehensive and complete, and to fully convey the concepts of the exemplary implementations to those skilled in the art. The same reference numerals in the figures denote the same or similar structures, and thus the repeated description thereof will be omitted. In addition, the drawings are merely schematic illustrations of the present disclosure, and are not necessarily drawn to scale.

Although relative terms such as "upper" and "lower" are used in this specification to describe the relative relationship between one component and another component, these terms are used in this specification just for convenience, for example, in the direction as shown in the drawings. It can be understood that, if the device as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "the", "said" and "at least one" are used to indicate the presence of one or more elements/components/etc.; the terms "comprising" and "having" are used to indicate non-exclusive inclusion and indicate the presence of other elements/components/etc. in addition to the listed elements/components/etc.; and the terms "first" and "second" are used only as marks, rather than limiting the number of objects.

FIG. 1 schematically shows a flowchart of a method for manufacturing a semiconductor device according to an embodiment of the present disclosure.

As shown in FIG. 1, the method according to an embodiment of the present disclosure may comprise the following steps.

S110: A semiconductor substrate is provided, the semiconductor substrate comprising a shallow trench and active areas isolated from the shallow trench.

In the embodiment of the present disclosure, providing a semiconductor substrate may be used to provide an operating platform for subsequent processes. The semiconductor substrate may be made of any base material used to bear elements of a semiconductor integrated circuit. It may be a die, or a wafer processed by an epitaxial growth process. The semiconductor substrate may be, for example, any one or more of a silicon-on-insulator (SOI) substrate, a bulk silicon substrate, a germanium substrate, a silicon germanium substrate, an indium phosphide (InP) substrate, a gallium arsenide (GaAs) substrate, a germanium-on-insulator substrate, etc.

The active area is used to establish the position of the transistor body, on which the source, drain and gate of the transistor are formed. Two active areas may be isolated by STI.

S120: An oxygen-containing layer is formed on the exposed outer surfaces of the shallow trench and the active areas.

In an exemplary embodiment, the oxygen-containing layer may comprise at least one of a linear oxide layer, an oxide/nitride stack structure, and an oxide/nitride/oxide stack structure (ONO structure).

The linear oxide layer may be, for example, an oxide layer formed in a high-temperature furnace. The oxide/nitride stack structure is a structure formed by stacking a nitride layer on an oxide layer and then stacking another oxide layer on the nitride layer, and so on. The structure formed by stacking one on another of oxide layers and nitride layers. Parameters, such as the number and thickness, of the oxide layer and the nitride layer are not limited in the present disclosure. The oxide/nitride/oxide stack structure is a structure formed by stacking at least one oxide layer, nitride layer and oxide layer one on another. Each oxide/nitride/oxide stack structure comprises an oxide layer, a nitride layer and an oxide layer, which are stacked one on another.

S130: A first isolation layer of a set height is filled in the shallow trench comprising the oxygen-containing layer on its surface, the set height being lower than the heights of the active areas.

In an exemplary embodiment, material for the first isolation layer may comprise at least one of oxide, tetraethyl orthosilicate (TEOS), spin-on organic carbon, amorphous carbon, photoresist, and silicon-containing polymer.

In an exemplary embodiment, the method may further comprise: setting the set height according to the depths of the wordline trenches in the active areas.

In the embodiment of the present disclosure, starting from the bottom of the shallow trench, the set height may be, for example, 100 nm to 160 nm, but the present disclosure is not limited thereto. The setting of the set height depends upon the depths of the wordlines to be formed in the active areas, which in turn depends upon the depths of the wordline trenches in the active areas.

S140: An etch stop layer is formed on the upper surface of the first isolation layer.

In an exemplary embodiment, the thickness of the etch stop layer may range from 2 nm to 10 nm. For example, the thickness of the etch stop layer may be set to any one of 2 nm, 4 nm, 5 nm, 8 nm, 9 nm or 10 nm. However, the present disclosure is not limited thereto, and the thickness of the etch stop layer may be determined according to actual needs.

In an exemplary embodiment, material for the etch stop layer may comprise at least one of silicon nitride (SiN), silicon carbonitride (SiCN), and silicon oxycarbonitride (SiCON). The etch stop layer may also be called etch termination layer.

S150: A second isolation layer is filled on the etch stop layer in the shallow trench to form a shallow trench isolation structure.

In an exemplary embodiment, the second isolation layer comprises at least one of an oxide layer, an oxide/nitride stack structure, and an oxide/nitride/oxide stack structure.

S160: The active areas and the shallow trench isolation structure are etched to form wordline trenches, wherein the bottoms of the wordline trenches in the shallow trench isolation structure are higher than the set height.

In an exemplary embodiment, the bottoms of the wordline trenches in the shallow trench isolation structure and the bottoms of the wordline trenches in the active areas may be both flush with the upper surface of the etch stop layer.

In the embodiment of the present disclosure, WL trenches may be formed in the active areas and the STI structure by photomask etching, respectively. The depths of the wordlines in the active areas were used as a reference to set the set height of the first isolation layer and then an etch stop layer is formed on the first isolation layer of the set height. Therefore, it is able to avoid the too large depths of the wordline trenches in the STI structure due to the etch selectivity ratio. The depths of the wordline trenches in the active areas and in the STI structure are approximate. Ideally, the depths of the wordline trenches in the active areas and in the STI structure may be made the same. That is, the bottoms of the wordline trenches in the active areas and the bottoms of the wordline trenches in the STI structure are both flush with the upper surface of the etch stop layer so that, in the subsequent process, the depths of the wordlines in the active areas and in the STI structure are the same.

In the method for manufacturing the semiconductor device according to the implementations of the present disclosure, an etch stop layer is formed at a set height of the first isolation layer in the shallow trench during the formation of the STI so that, during the subsequent formation of the WL trenches by etching, the etching of the WL trenches in the STI structure can be stopped by the etch stop layer. In this way, depths of WL trenches of almost the same as those of the WL trenches in the active areas may be formed in the STI structure. On one hand, since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. On the other hand, the length of the WLs can be shortened to reduce the conductive resistance.

Figure 2:
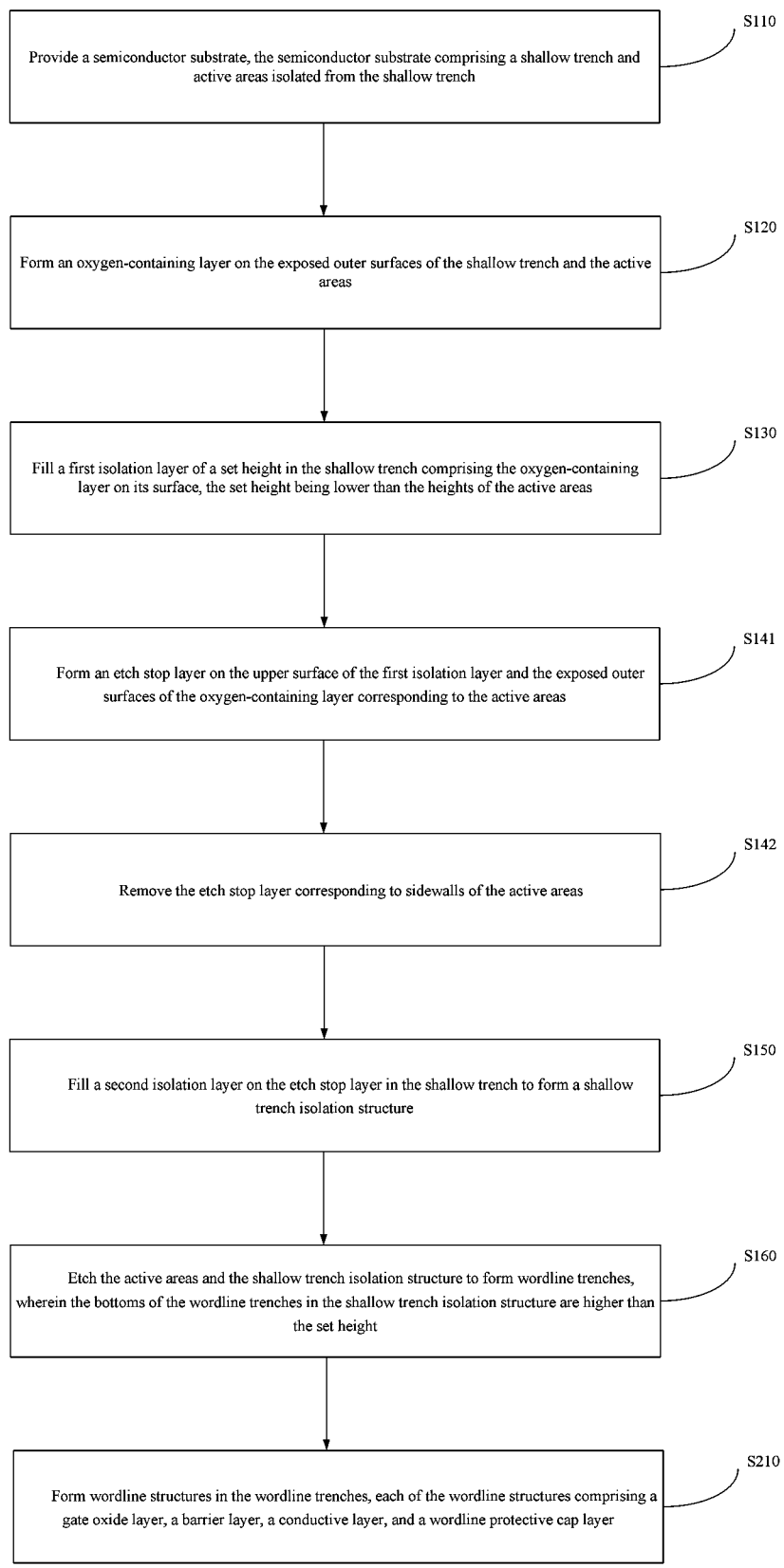
FIG. 2 schematically shows a flowchart of a method for manufacturing a semiconductor device according to an embodiment of the present disclosure.

FIG. 2 schematically shows a flowchart of a method for manufacturing a semiconductor device according to an embodiment of the present disclosure. As shown in FIG. 2, the method according to an embodiment of the present disclosure may comprise the following steps.

S110: A semiconductor substrate is provided, the semiconductor substrate comprising a shallow trench and active areas isolated from the shallow trench.

Figure 3:
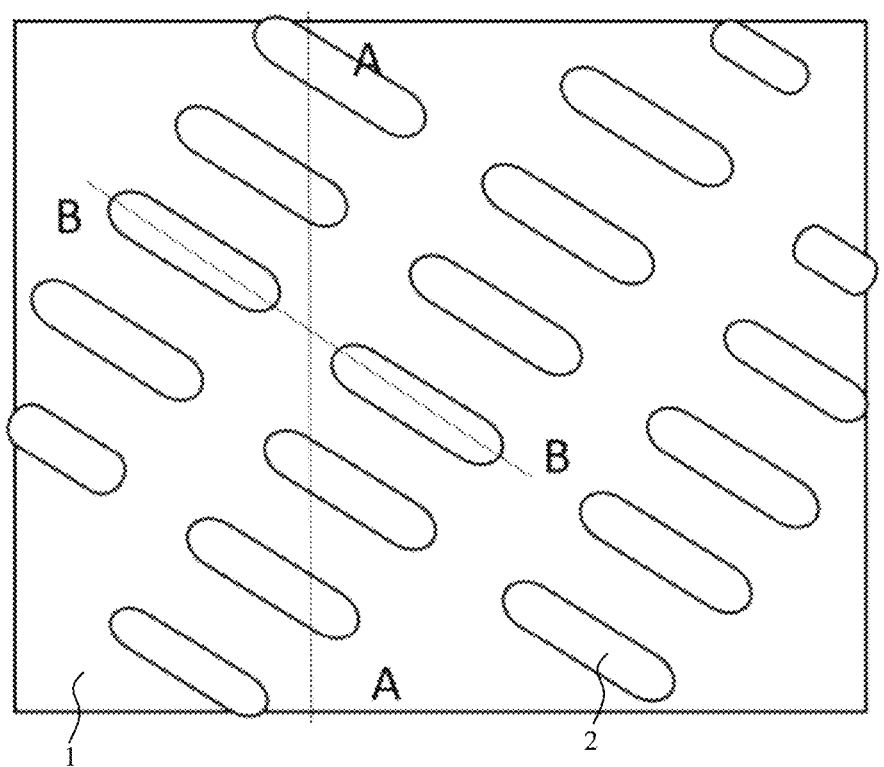
FIGS. 3-25 schematically show a flowchart of a method for manufacturing a semiconductor device according to an embodiment of the present disclosure.
Figure 4:
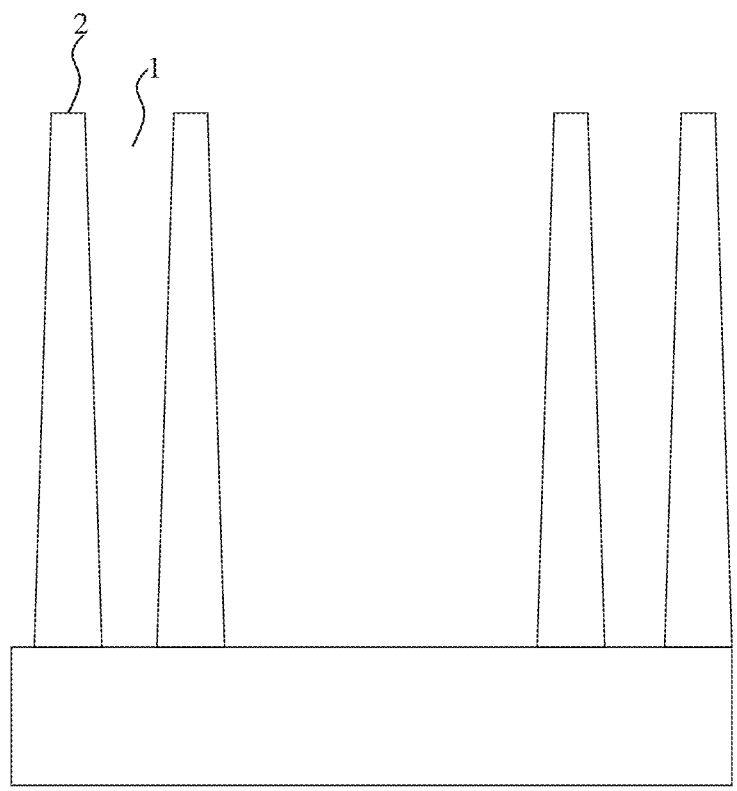
Figure 5:
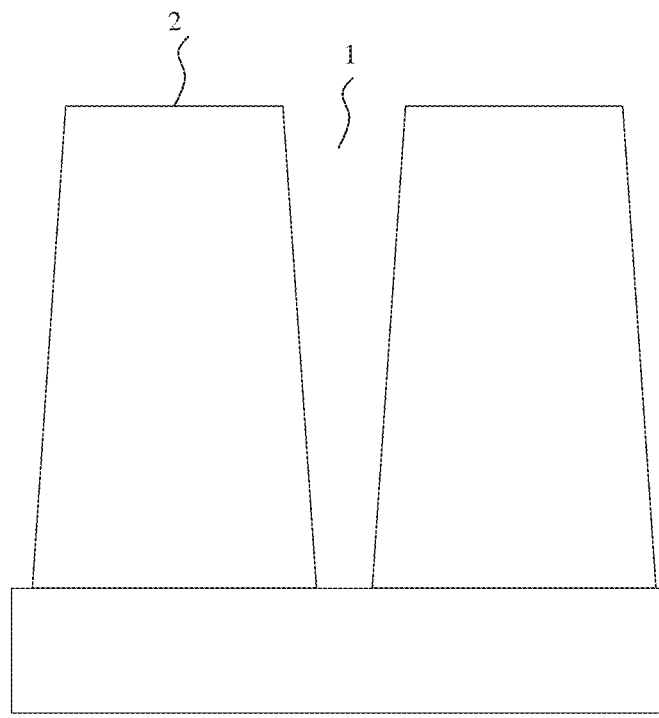

As shown in FIGS. 3-5, the semiconductor substrate comprises a shallow trench 1 and active areas 2 isolated from the shallow trench.

In the embodiment of FIG. 3, in the plane of the surface of the semiconductor substrate, a longitudinal direction (that is, the extension direction AA in FIG. 3 which is a top view) and a transverse direction (not shown, that is, the horizontal direction from left to right in FIG. 3 which is a top view), which are perpendicular to each other, may be pre-defined. For example, when the shallow trench isolation structure is used to define the active areas corresponding to the storage cells in the storage array, the longitudinal direction may be defined as a direction having a certain angle from the extension direction (not shown) of the wordlines or the extension direction (for example, the extension direction BB in FIG. 3 which is a top view) of the bitlines, and the transverse direction is a direction perpendicular to the longitudinal direction. Of course, in other embodiments of the present disclosure, the longitudinal direction may be defined as a direction the same as the extension direction of the wordlines or the extension direction of the bitlines, and the transverse direction is a direction perpendicular to the longitudinal direction.

FIG. 4 is a cross-sectional view of FIG. 3 in the direction AA. FIG. 5 is a cross-sectional view of FIG. 3 in the direction BB. The direction BB intersects the direction AA, and may be the extension direction of the active areas.

S120: An oxygen-containing layer is formed on the exposed outer surfaces of the shallow trench and the active areas.

Figure 6:
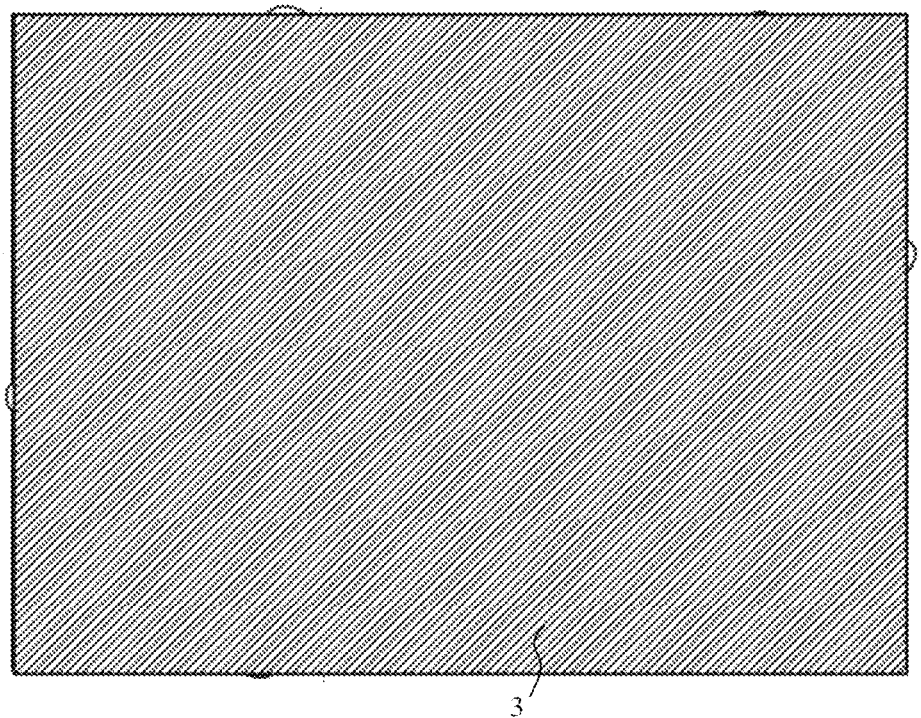
Figure 7:
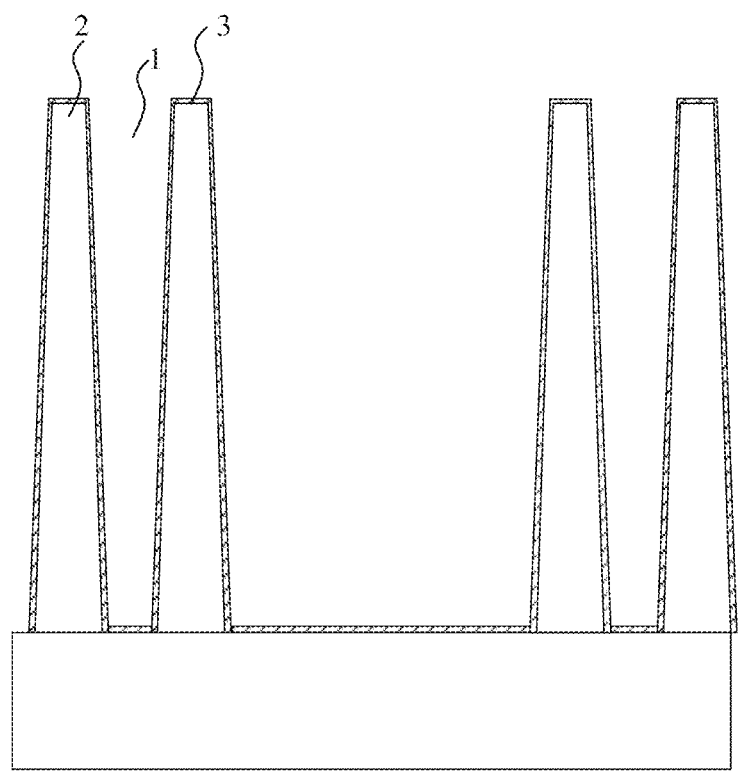
Figure 8:
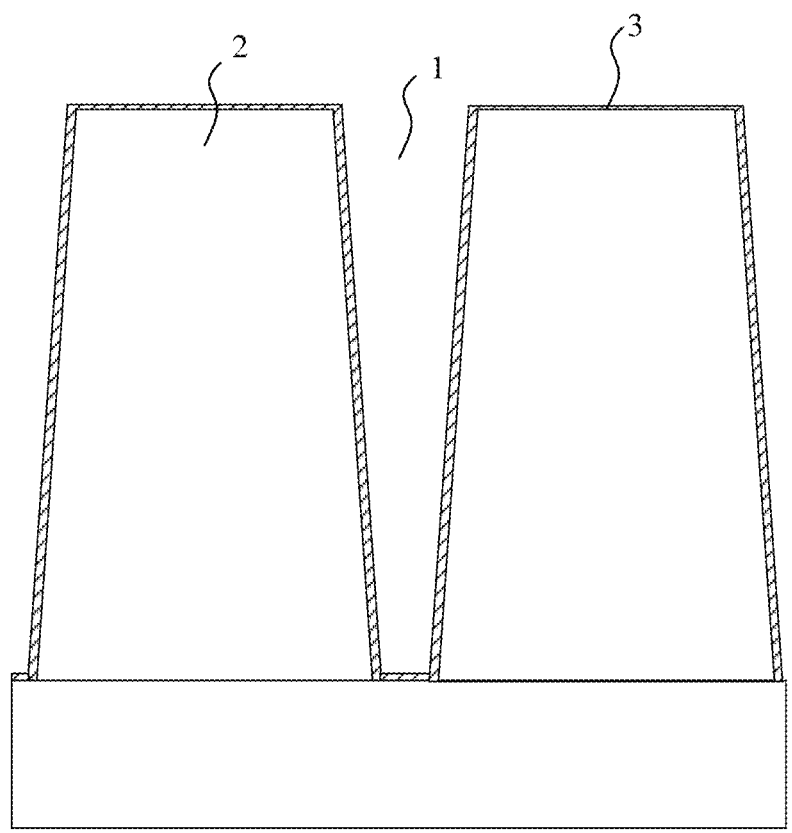

As shown in FIGS. 6-8, an oxygen-containing layer 3 is formed on the exposed outer surfaces of the shallow trench 1 and the active areas 2, for example a liner oxide, oxide/nitride or ONO structure. FIG. 6 is a top view. FIG. 7 is a cross-sectional view of FIG. 6 in the direction AA. FIG. 8 is a cross-sectional view of FIG. 6 in the direction BB.

S130: A first isolation layer of a set height is filled in the shallow trench comprising the oxygen-containing layer on its surface, the set height being lower than the heights of the active areas.

Figure 9:
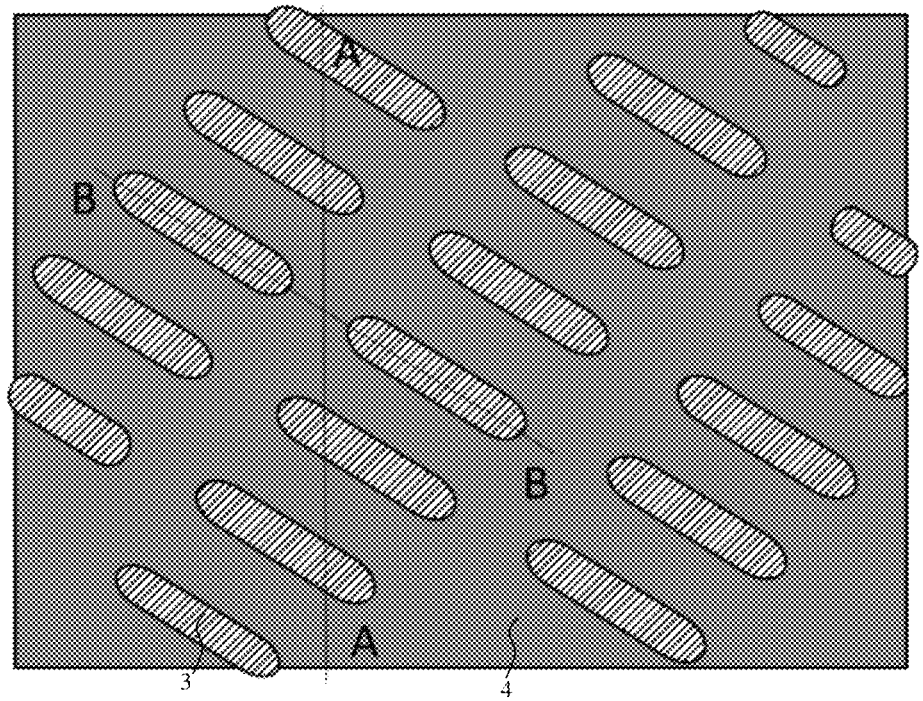
Figure 10:
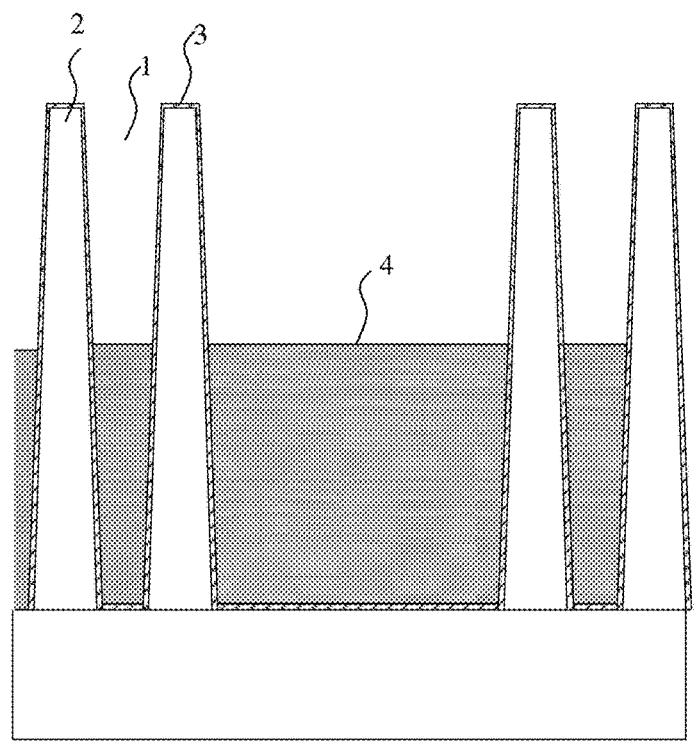
Figure 11:
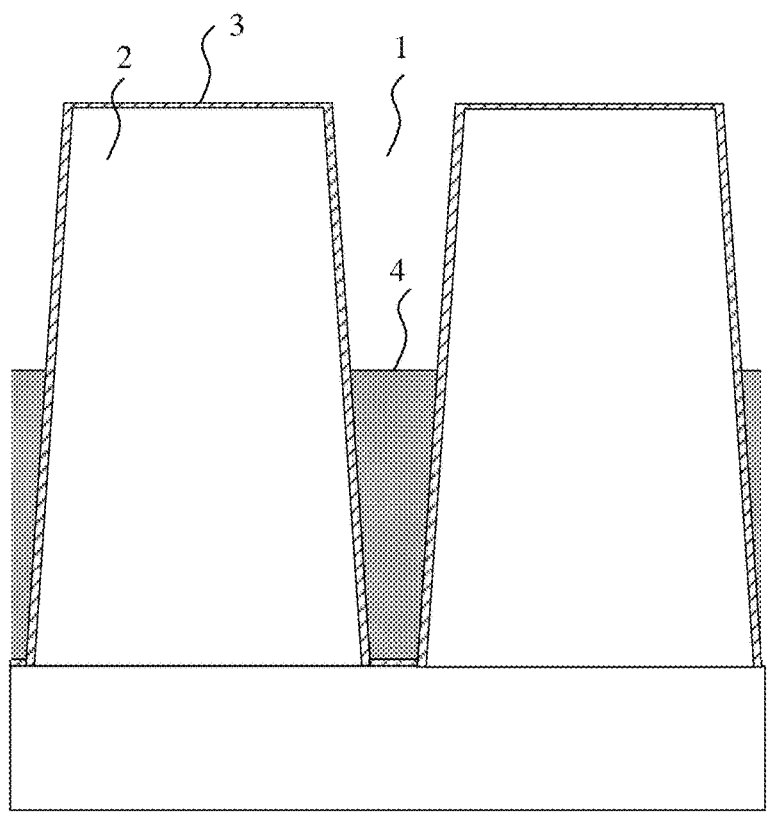

As shown in FIGS. 9-11, a first isolation layer 4 of a set height is filled on the shallow trench 1 comprising the oxygen-containing layer 3 on its surface. The first isolation layer 4 may be, for example, made of any one or more of oxide, TEOS, spin-on organic carbon, amorphous carbon, photoresist and silicon-containing polymer. FIG. 9 is a top view. FIG. 10 is a cross-sectional view of FIG. 9 in the direction AA. FIG. 11 is a cross-sectional view of FIG. 9 in the direction BB.

S141: An etch stop layer is formed on the upper surface of the first isolation layer and the exposed outer surfaces of the oxygen-containing layer corresponding to the active areas.

Figure 12:
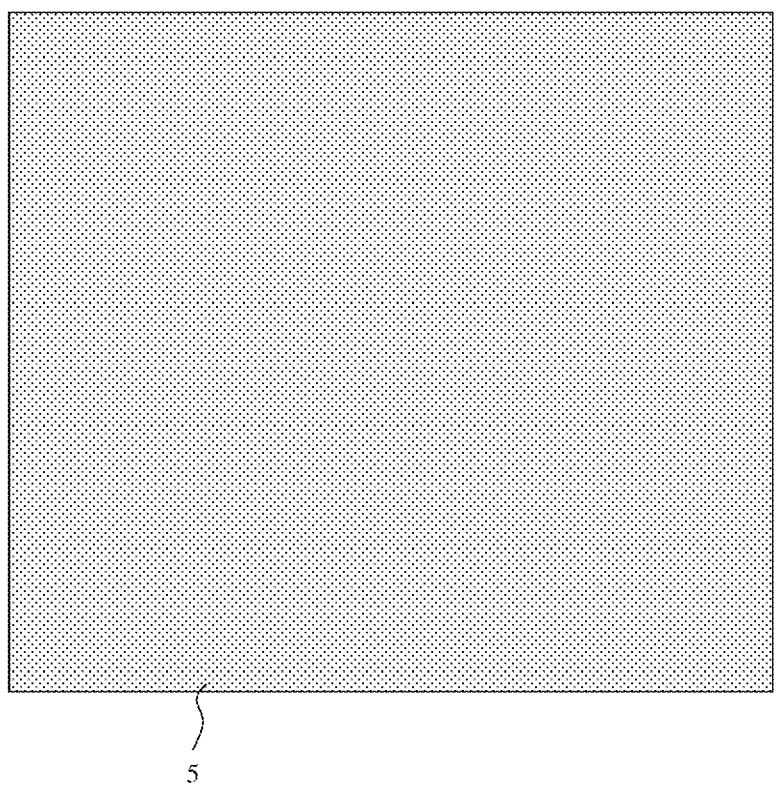
Figure 13:
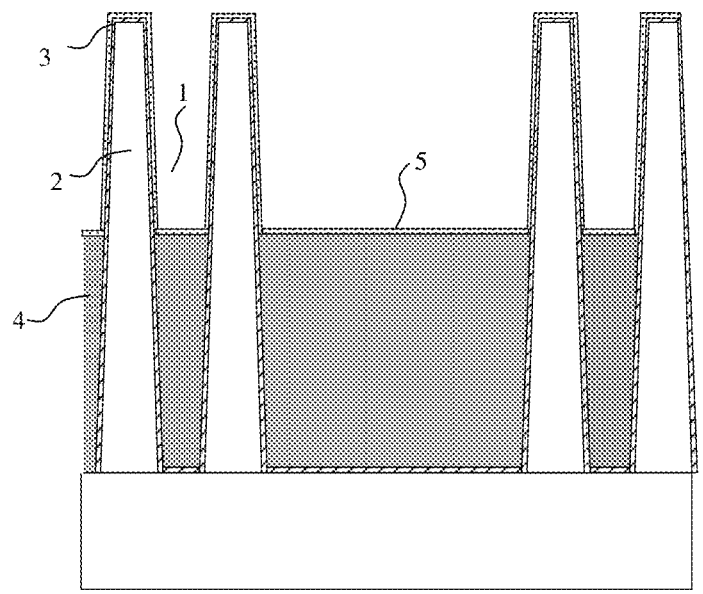
Figure 14:
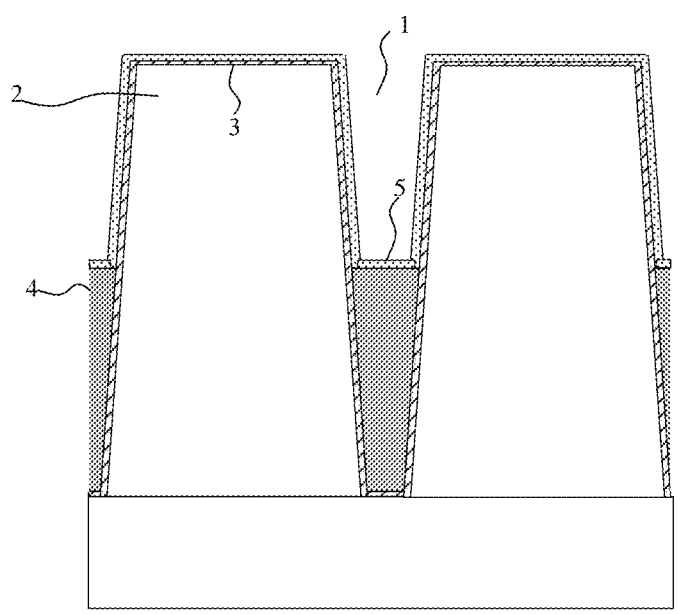

As shown in FIGS. 12-14, an etch stop layer 5 is formed on the upper surface of the first isolation layer 4 and the exposed outer surfaces of the oxygen-containing layer 3 corresponding to the active areas 2. The etch stop layer 5 may be made of, for example, any one or more of SiN, SiCN, SiCON, and the like. FIG. 12 is a top view. FIG. 13 is a cross-sectional view of FIG. 12 in the direction AA. FIG. 14 is a cross-sectional view of FIG. 12 in the direction BB.

S142: The etch stop layer corresponding to sidewalls of the active areas is removed.

Figure 15:
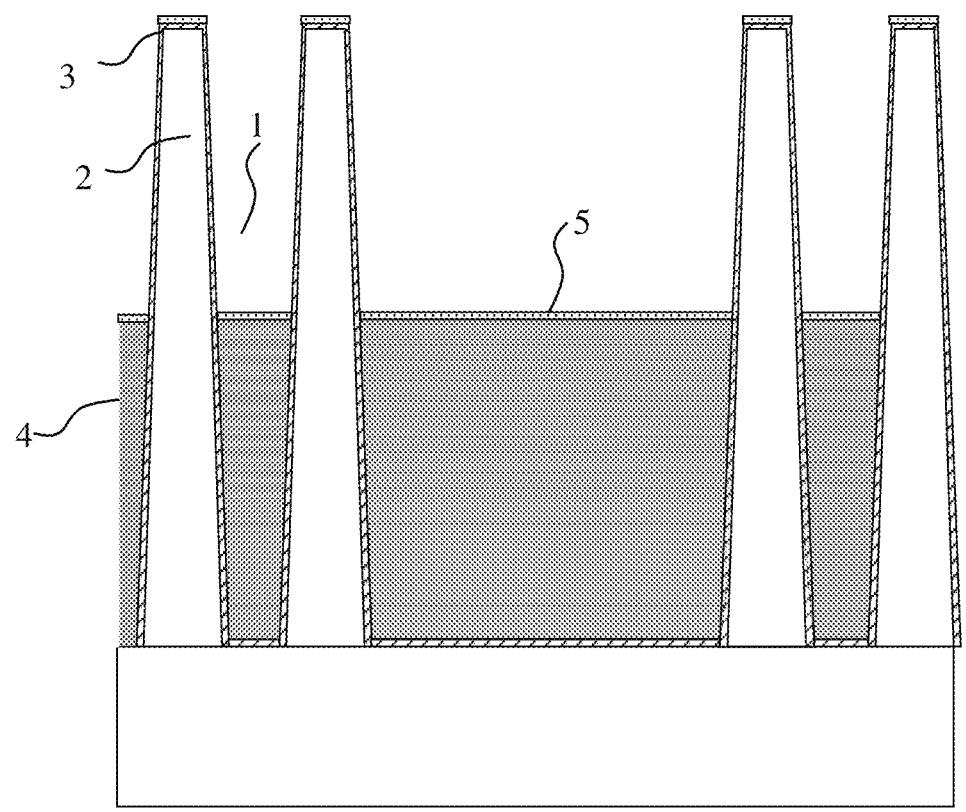
Figure 16:
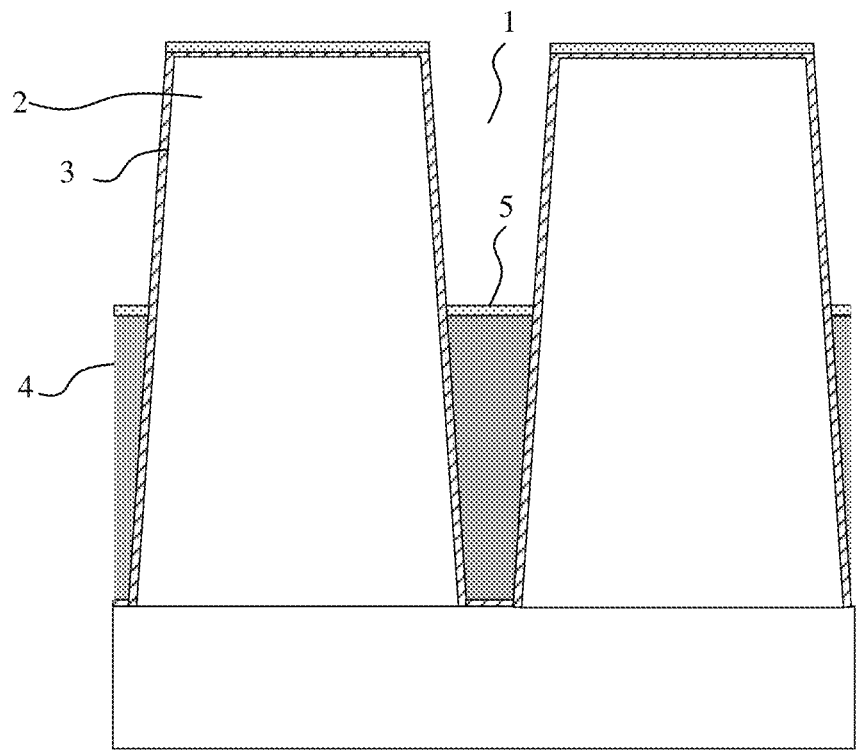

As shown in FIGS. 15 and 16, the etch stop layer 5 corresponding to the sidewalls of the active areas 2 is removed, the etch stop layer 5 on the surface of the first isolation layer 4 is retained, and the etch stop layer 5 on the oxygen-containing layer 3 corresponding to the upper surfaces of the active areas 2 is retained. The top views of FIG. 15 and FIG. 16 are the same as FIG. 12. FIG. 15 is a cross-sectional view in the direction AA. FIG. 16 is a cross-sectional view in the direction BB.

S150: A second isolation layer is filled on the etch stop layer in the shallow trench to form a shallow trench isolation structure.

Figure 17:
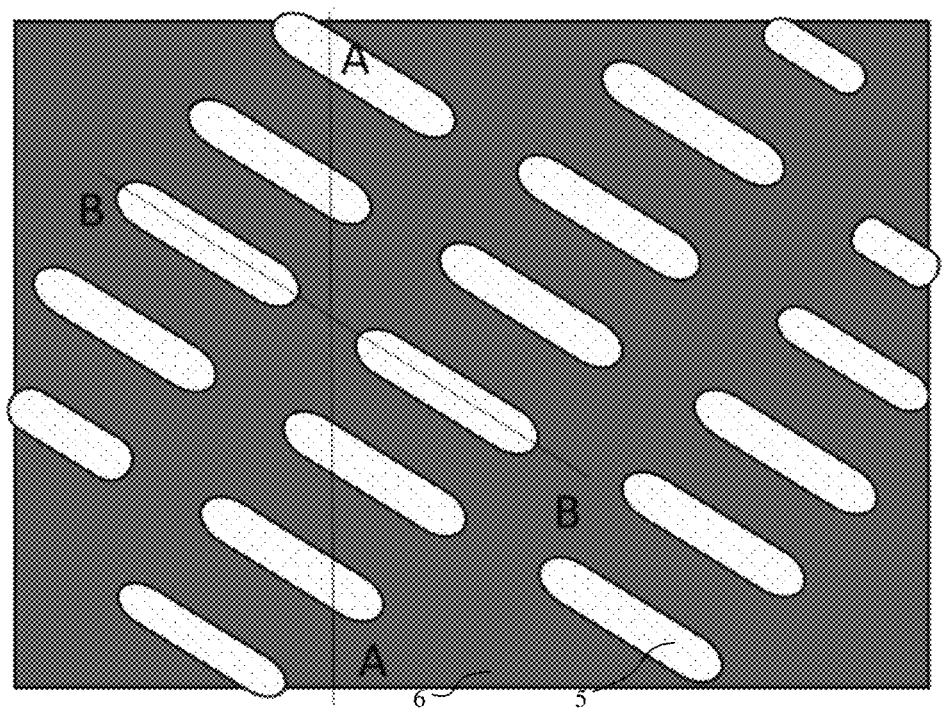
Figure 18:
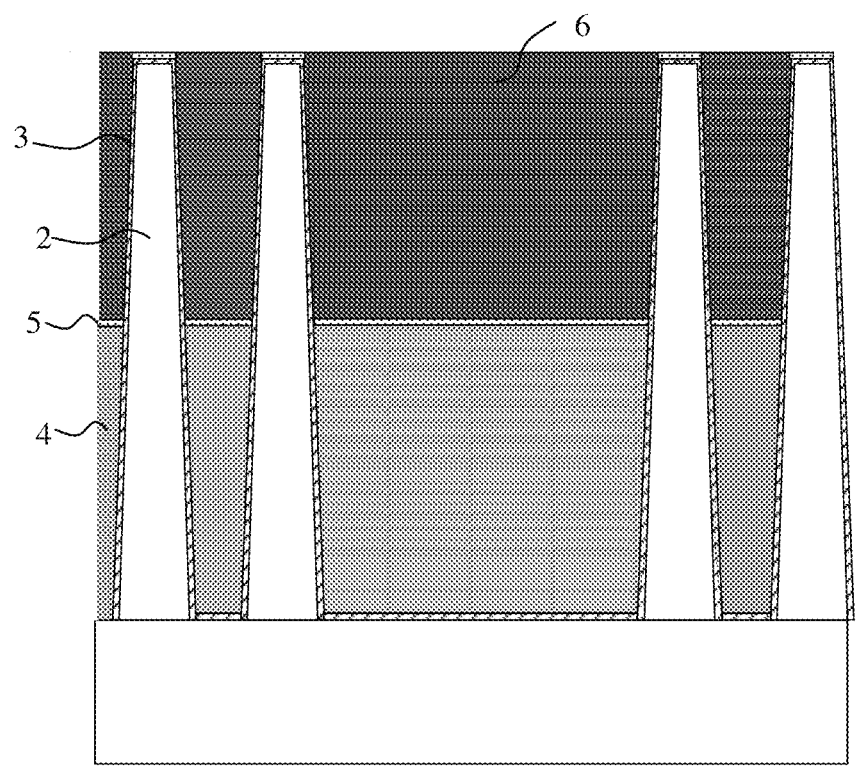
Figure 19:
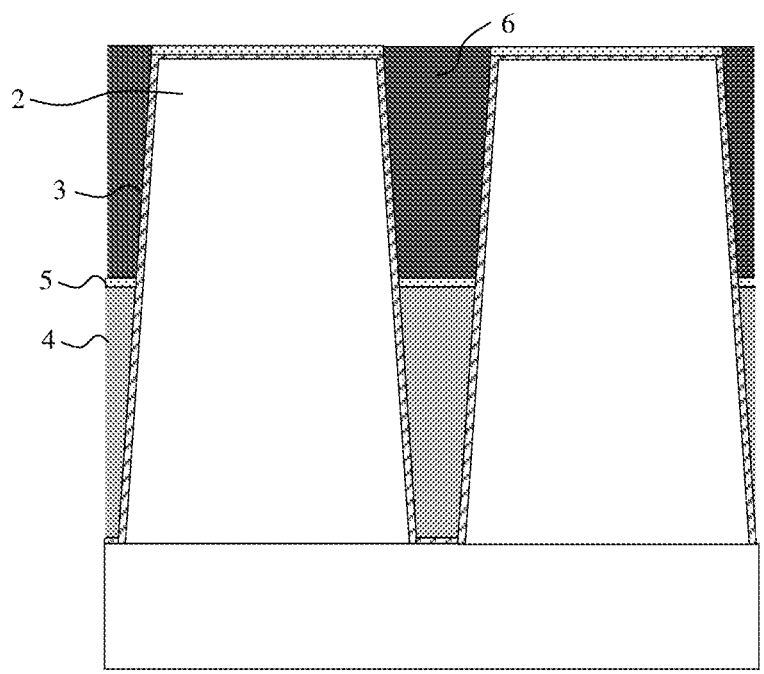

As shown in FIGS. 17-19, a second isolation layer 6 is filled on the etch stop layer 5 in the shallow trench 1 to form an STI structure. The second isolation layer 6 may be formed by depositing an oxide or oxide/nitride or ONO structure, for example. FIG. 17 is a top view. FIG. 18 is a cross-sectional view of FIG. 17 in the direction AA. FIG. 19 is a cross-sectional view of FIG. 17 in the direction BB.

S160: The active areas and the shallow trench isolation structure are etched to form wordline trenches, wherein the bottoms of the wordline trenches in the shallow trench isolation structure are higher than the set height.

Figure 20:
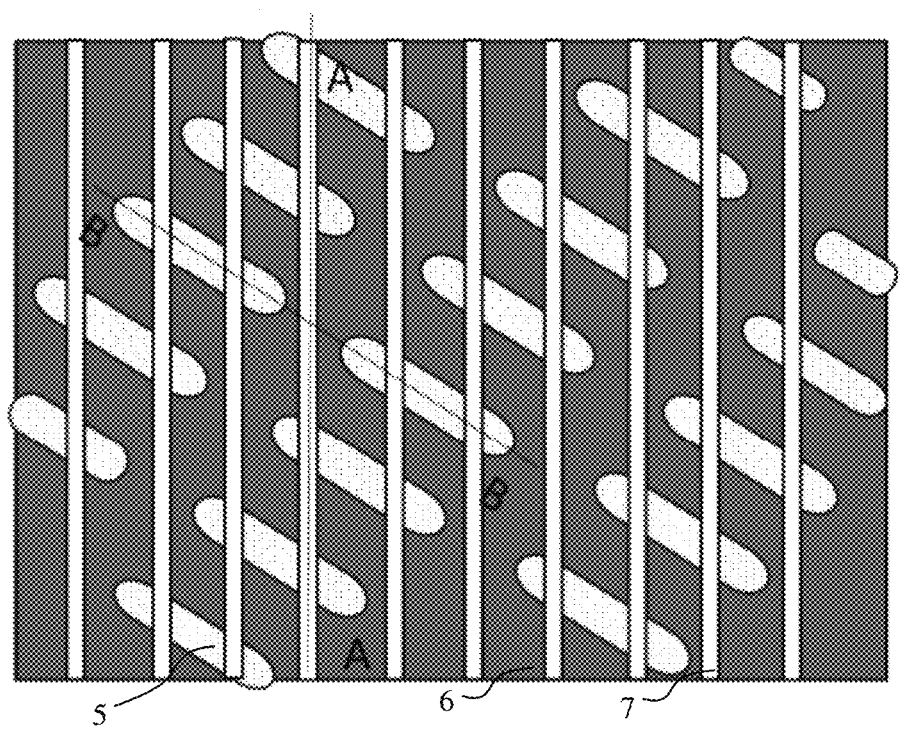
Figure 21:
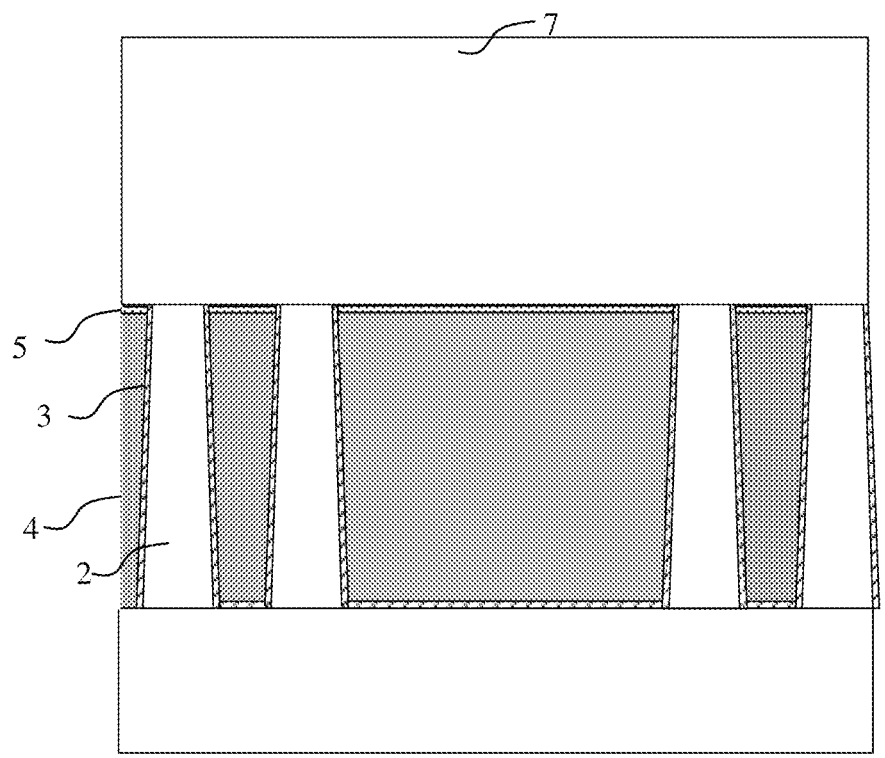
Figure 22:
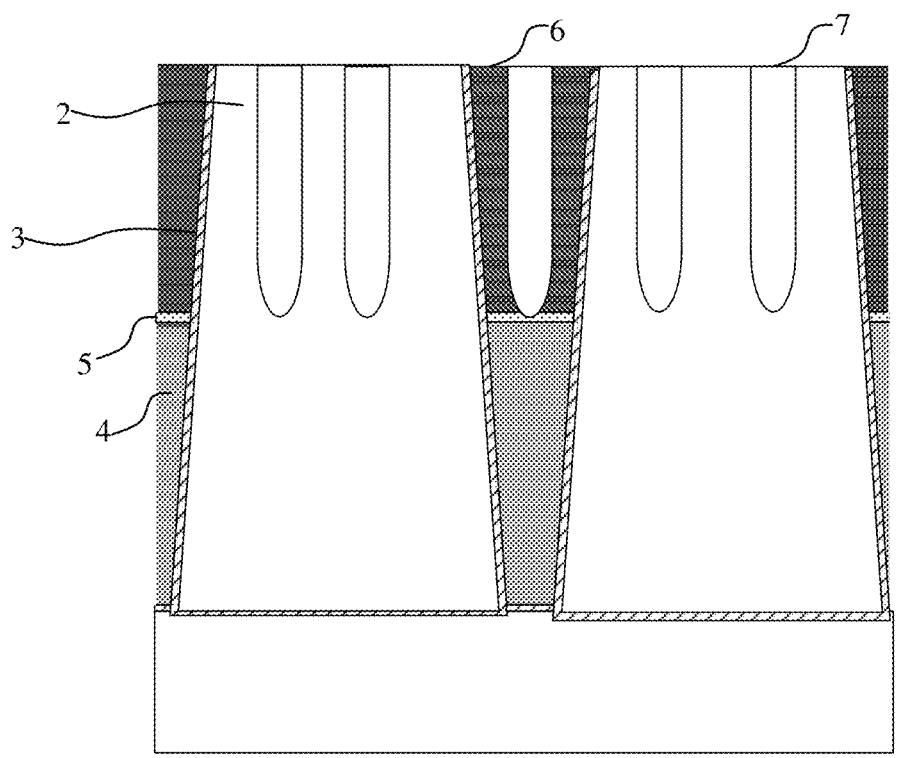

As shown in FIGS. 20-22, the active areas 2 and the STI structure are etched by using a photomask to form wordline trenches 7 in the active areas and the STI structure, respectively. Because there is an etch stop layer 5 at the bottom of the STI structure, the bottoms of the wordline trenches 7 in the shallow trench isolation structure is higher than the set height. That is, when the wordline trenches 7 in the STI structure are formed by etching, due to the presence of the etch stop layer 5, the depths of the wordline trenches 7 in the STI structure do not exceed the etch stop layer 5, so that the depths of the wordline trenches in the STI structure and the active areas are almost the same. FIG. 20 is a top view. FIG. 21 is a cross-sectional view of FIG. 20 in the direction AA. FIG. 22 is a cross-sectional view of FIG. 20 in the direction BB.

S210: Wordline structures are formed in the wordline trenches, each of the wordline structures comprising a gate oxide layer, a barrier layer, a conductive layer, and a wordline protective cap layer.

Figure 23:
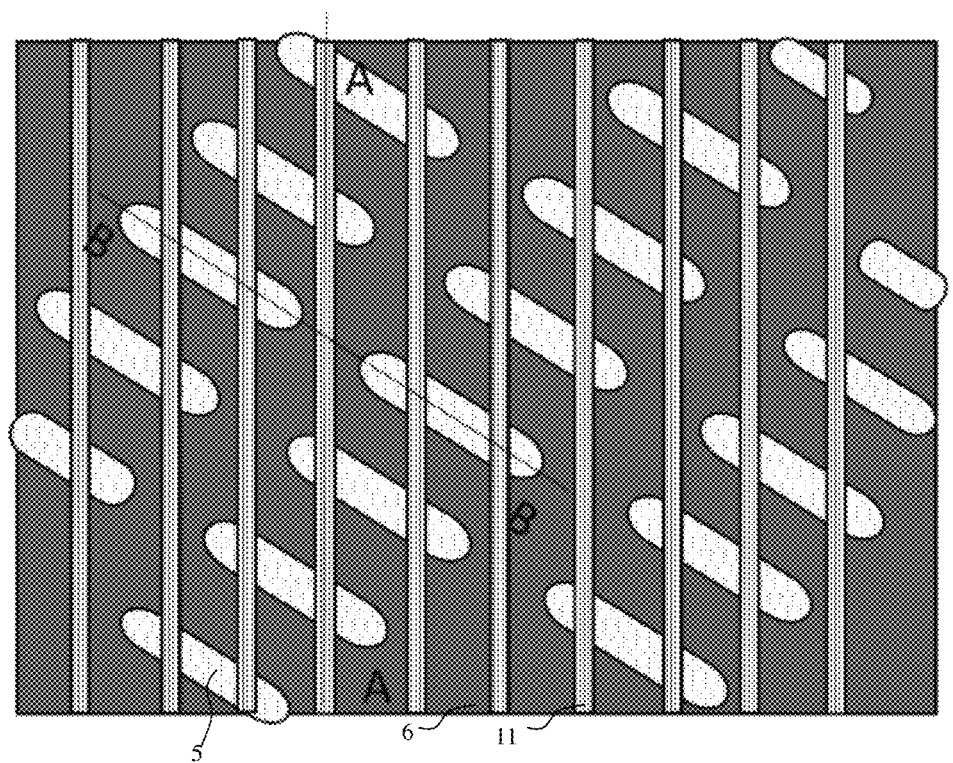
Figure 24:
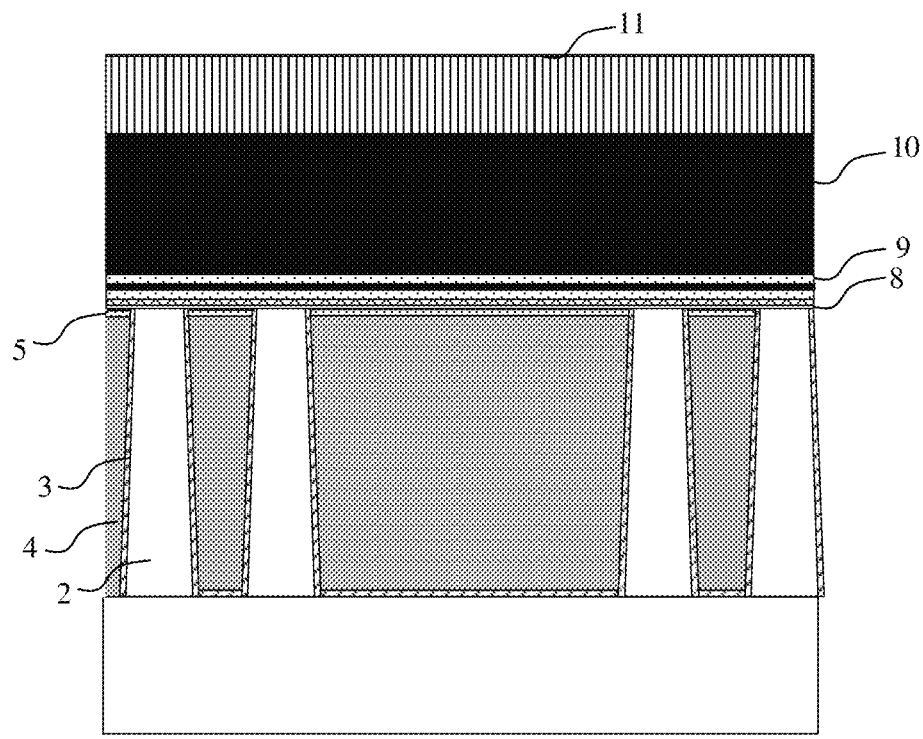
Figure 25:
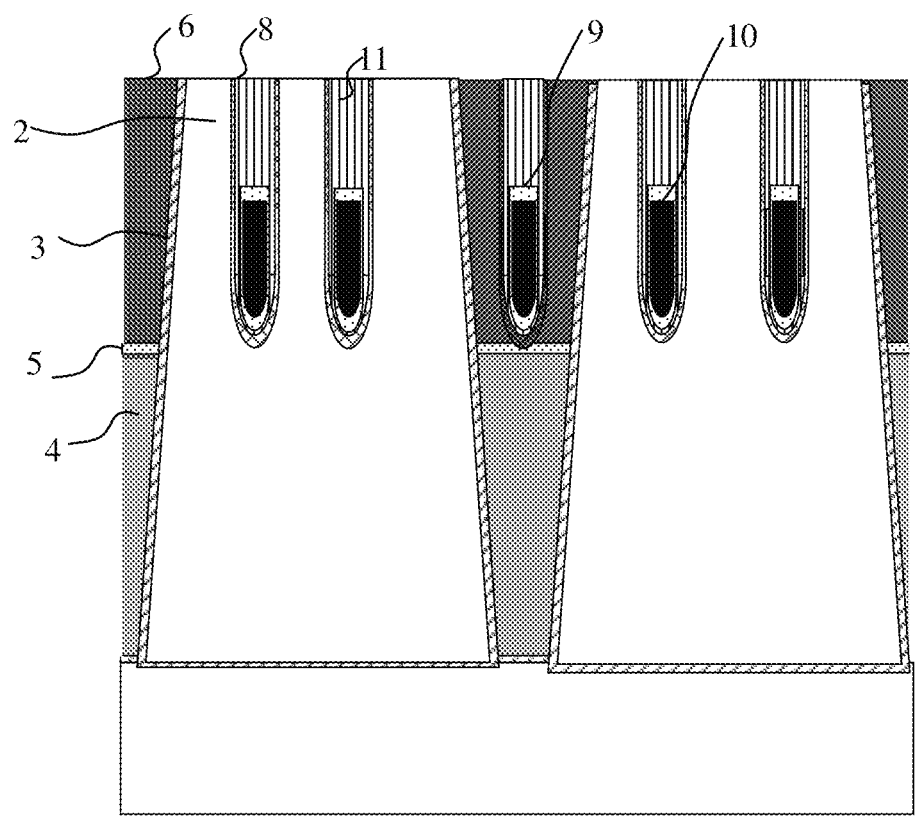

As shown in FIGS. 23-25, a gate oxide layer 8, a barrier layers 9 (for example, it may be made of tin, but the present disclosure is not limited thereto), a conductive layer 10 (for example, it may be made of metal tungsten W, but the present disclosure is not limited thereto), and a wordline protective cap layer (for example, it made be nitride) may be formed in each of the wordline trenches in the active areas and the STI structure, to form the WL structures in the active areas and in the STI structure. FIG. 23 is a top view. FIG. 24 is a cross-sectional view of FIG. 23 in the direction AA. FIG. 25 is a cross-sectional view of FIG. 23 in the direction BB.

It may be understood that the processes to form the wordline in the wordline trenches and the structure of the wordline are not limited in the present disclosure.

By the method for manufacturing the semiconductor device according to the embodiment of the present disclosure, a first isolation layer of a set height is filled in a shallow trench during the formation of the STI structure, the set height depending upon the required depths of the wordlines in the active areas; an etch stop layer is formed on the upper surface of the first isolation layer and the exposed outer surfaces of the oxygen-containing layer corresponding to the active areas; and then the etch stop layer corresponding to the sidewalls of the active areas is removed. Therefore, during the subsequent formation of the WL trenches in the active areas and the STI structure by etching, the further etching of the WL trenches in the STI structure can be stopped by the etch stop layer retained at the bottom of the STI structure. In this way, a WL trenches of depths almost the same as those of the WL trenches in the active areas may be formed in the STI structure. On one hand, since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. On the other hand, the length of the WLs can be shortened to reduce the conductive resistance.

Figure 26:
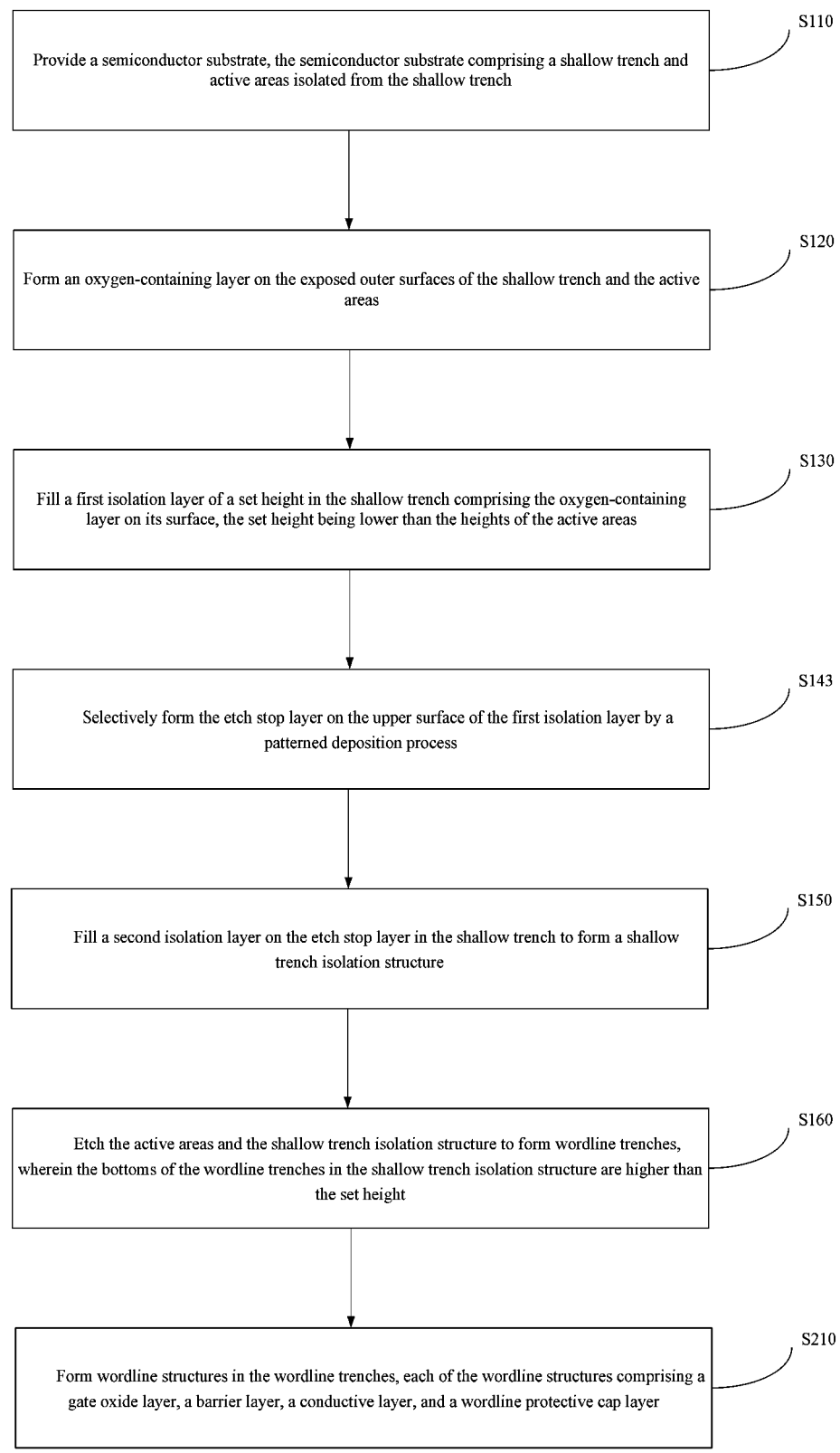
FIG. 26 schematically shows a flowchart of a method for manufacturing a semiconductor device according to an embodiment of the present disclosure.

FIG. 26 schematically shows a flowchart of a method for manufacturing a semiconductor device according to an embodiment of the present disclosure. As shown in FIG. 26, the method according to an embodiment of the present disclosure may comprise the following steps.

S110: A semiconductor substrate is provided, the semiconductor substrate comprising a shallow trench and active areas isolated from the shallow trench.

S120: An oxygen-containing layer is formed on the exposed outer surfaces of the shallow trench and the active areas.

S130: A first isolation layer of a set height is filled in the shallow trench comprising the oxygen-containing layer on its surface, the set height being lower than the heights of the active areas.

For steps S110-S130 in the embodiment of FIG. 26, reference may be made to the description of the embodiments in FIGS. 1-25.

S143: The etch stop layer is selectively formed on the upper surface of the first isolation layer by a patterned deposition process.

The difference with the above embodiments is that, for example, the FIGS. 12-16 may be replaced by a patterned deposition process directly, and the etch stop layer is formed only on the upper surface of the first isolation layer. This can further simplify the process. There is no need to subsequently remove the etch stop layer on the sidewalls of the active areas.

S150: A second isolation layer is filled on the etch stop layer in the shallow trench to form a shallow trench isolation structure.

S160: The active areas and the shallow trench isolation structure are etched to form wordline trenches, wherein the bottoms of the wordline trenches in the shallow trench isolation structure are higher than the set height.

S210: Wordline structures are formed in the wordline trenches, each of the wordline structures comprising a gate oxide layer, a barrier layer, a conductive layer, and a wordline protective cap layer.

For steps S150, S160, and S210 in the embodiment of FIG. 26, reference may be made to the description of the embodiments in FIGS. 1-25.

By the method for manufacturing the semiconductor device according to the embodiments of the present disclosure, a first isolation layer of a set height is filled in a shallow trench during the formation of the STI structure, the set height depending upon the required depths of the wordlines in the active areas; and an etch stop layer is formed only on the upper surface of the first isolation layer. In this way, the process step of removing the etch stop layer corresponding to the sidewalls of the active areas is omitted, so the process flow becomes simpler. Meanwhile, during the subsequent formation of the WL trenches in the active areas and the STI structure by etching, the further etching of the WL trenches in the STI structure can be stopped by the etch stop layer retained at the bottom of the STI structure. In this way, the depths of WL trenches almost the same as those of the WL trenches in the active areas may be formed in the STI structure. In addition, since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. On the other hand, the length of the WLs can be shortened to reduce the conductive resistance.

The method for manufacturing the semiconductor device according to the embodiment of the present disclosure may be applied to the preparation of a semiconductor device with a buried gate structure.

Further, an implementation of the present disclosure further provides a semiconductor device which may comprise a semiconductor substrate. The semiconductor substrate may further comprise a shallow trench and an active areas isolated from the shallow trench.

An oxygen-containing layer may be formed at the bottom of the shallow trench and the surfaces of the active areas. A first isolation layer of a set height is filled on the upper surface of the oxygen-containing layer corresponding to the shallow trench, the set height being lower than the heights of the active areas. An etch stop layer may be formed on the upper surface of the first isolating layer. A shallow trench isolation structure is formed on the etch stop layer in the shallow trench, and the shallow trench isolation structure is formed by filling a second isolation layer. Wordline trenches are formed in the shallow trench isolation structure and the active areas, wherein the bottoms of the wordline trenches in the shallow trench isolation structure are higher than the set height.

In the semiconductor device according to the implementation of the present disclosure, an etch stop layer is formed at the set height of the first isolation layer in the shallow trench. The further etching of the WL trenches in the STI structure can be stopped by the etch stop layer. In this way, the depths of WL trenches almost the same as those of the WL trenches in the active areas may be formed in the STI structure. On one hand, since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. On the other hand, the length of the WLs can be shortened to reduce the conductive resistance.

In an exemplary embodiment, the oxygen-containing layer may comprise at least one of a linear oxide layer, an oxide/nitride stack structure, and an oxide/nitride/oxide stack structure.

In an exemplary embodiment, material for the first isolation layer may comprise at least one of oxide, tetraethyl orthosilicate, spin-on organic carbon, amorphous carbon, photoresist, and silicon-containing polymer.

In an exemplary embodiment, the second isolation layer comprises at least one of an oxide layer, an oxide/nitride stack structure, and an oxide/nitride/oxide stack structure.

In an exemplary embodiment, wordline structures may be formed in the wordline trenches. Each of the wordline structures may comprises a gate oxide layer, a barrier layer, a conductive layer, and a wordline protective cap layer.

In an exemplary embodiment, material for the etch stop layer may comprise at least one of silicon nitride, silicon carbonitride, and silicon oxycarbonitride.

Those skilled in the art will readily think of other embodiments of the present disclosure by considering the specification and practicing the invention disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

The invention claimed is:

1. A method for manufacturing a semiconductor device, comprising:

provsiding a semiconductor substrate, the semiconductor substrate comprising a shallow trench and active areas isolated from the shallow trench;

forming an oxygen-containing layer on exposed outer surfaces of the shallow trench and the active areas;

filling a first isolation layer of a set height in the shallow trench comprising the oxygen-containing layer on the surface of the shallow trench, the set height being lower than heights of the active areas;

forming an etch stop layer on an upper surface of the first isolation layer;

filling a second isolation layer on the etch stop layer in the shallow trench to form a shallow trench isolation structure; and etching the active areas and the shallow trench isolation structure to form wordline trenches, wherein bottoms of the wordline trenches in the shallow trench isolation structure are higher than the set height.

2. The method for manufacturing the semiconductor device according to claim 1, wherein the forming an etch stop layer on an upper surface of the first isolation layer comprises:

forming the etch stop layer on the upper surface of the first isolation layer and the exposed outer surfaces of the oxygen-containing layer corresponding to the active areas; and removing the etch stop layer corresponding to sidewalls of the active areas.

3. The method for manufacturing the semiconductor device according to claim 2, wherein a thickness of the etch stop layer ranges from 2 nm to 10 nm.

4. The method for manufacturing the semiconductor device according to claim 1, wherein the forming an etch stop layer on an upper surface of the first isolation layer comprises:

selectively forming the etch stop layer on the upper surface of the first isolation layer by a patterned deposition process.

5. The method for manufacturing the semiconductor device according to claim 4, wherein a thickness of the etch stop layer ranges from 2 nm to 10 nm.

6. The method for manufacturing the semiconductor device according to claim 1, wherein a thickness of the etch stop layer ranges from 2 nm to 10 nm.

7. The method for manufacturing the semiconductor device according to claim 6, wherein the bottoms of the wordline trenches in the shallow trench isolation structure and the bottoms of the wordline trenches in the active areas are both flush with an upper surface of the etch stop layer.

8. The method for manufacturing the semiconductor device according to claim 1, wherein the oxygen-containing layer comprises at least one of a linear oxide layer, an oxide/nitride stack structure, and an oxide/nitride/oxide stack structure.

9. The method for manufacturing the semiconductor device according to claim 1, wherein a material for the first isolation layer comprises at least one of oxide, tetraethyl orthosilicate, spin-on organic carbon, amorphous carbon, photoresist, and silicon-containing polymer.

10. The method for manufacturing the semiconductor device according to claim 1, wherein the second isolation layer comprises at least one of an oxide layer, an oxide/nitride stack structure, and an oxide/nitride/oxide stack structure.

11. The method for manufacturing the semiconductor device according to claim 1, further comprising:

forming wordline structures in the wordline trenches, each of the wordline structures comprising a gate oxide layer, a barrier layer, a conductive layer, and a wordline protective cap layer.

12. The method for manufacturing the semiconductor device according to claim 1, wherein a material for the etch stop layer comprises at least one of silicon nitride, silicon carbonitride, and silicon oxycarbonitride.

13. The method for manufacturing the semiconductor device according to claim 1, further comprising:
setting the set height according to depths of the wordline trenches in the active areas.

14. A semiconductor device, comprising:
a semiconductor substrate, comprising:
a shallow trench; and
active areas, isolated from the shallow trench; wherein,
an oxygen-containing layer is formed at a bottom of the shallow trench and surfaces of the active areas;
a first isolation layer of a set height is filled on an upper surface of the oxygen-containing layer corresponding to the shallow trench, the set height being lower than heights of the active areas;
an etch stop layer is formed on an upper surface of the first isolating layer;
a shallow trench isolation structure is formed on the etch stop layer in the shallow trench, and the shallow trench isolation structure is formed by filling a second isolation layer; and
wordline trenches are formed in the shallow trench isolation structure and the active areas, wherein bottoms of the wordline trenches in the shallow trench isolation structure are higher than the set height.

15. The semiconductor device according to claim 14, wherein a thickness of the etch stop layer ranges from 2 nm to 10 nm.

16. The semiconductor device according to claim 15, wherein the bottoms of the wordline trenches in the shallow trench isolation structure and the bottoms of the wordline trenches in the active areas are both flush with an upper surface of the etch stop layer.

17. The semiconductor device according to claim 14, wherein the bottoms of the wordline trenches in the shallow trench isolation structure and the bottoms of the wordline trenches in the active areas are both flush with an upper surface of the etch stop layer.

18. The semiconductor device according to claim 14, wherein wordline structures are formed in the wordline trenches and each of the wordline structures comprises a gate oxide layer, a barrier layer, a conductive layer, and a wordline protective cap layer.

* * * * *